(12) United States Patent
Doganis

(10) Patent No.: US 11,822,727 B2
(45) Date of Patent: Nov. 21, 2023

(54) SELECTION OF A FACE WITH AN IMMERSIVE GESTURE IN 3D MODELING

(71) Applicant: DASSAULT SYSTEMES, Vélizy-Villacoublay (FR)

(72) Inventor: Fivos Doganis, Vélizy-Villacoublay (FR)

(73) Assignee: DASSAULT SYSTEMES, Vélizy-Villacoublay (FR)

( * ) Notice: Subject to any disclaimer, the term of this patent is extended or adjusted under 35 U.S.C. 154(b) by 0 days.

(21) Appl. No.: 17/136,861

(22) Filed: Dec. 29, 2020

(65) Prior Publication Data
US 2021/0200322 A1    Jul. 1, 2021

(30) Foreign Application Priority Data

Dec. 30, 2019   (EP) ...................................... 19306790

(51) Int. Cl.
*G06F 3/01*      (2006.01)

(52) U.S. Cl.
CPC .................................... *G06F 3/017* (2013.01)

(58) Field of Classification Search
None
See application file for complete search history.

(56) References Cited

U.S. PATENT DOCUMENTS

| | | | |
|---|---|---|---|
| 9,070,402 B2 | 6/2015 | Burtnyk | |
| 11,175,749 B2 | 11/2021 | Roziere | |
| 2002/0056009 A1* | 5/2002 | Affif | ........................ G06F 9/451 709/246 |
| 2010/0234094 A1* | 9/2010 | Gagner | ................ G07F 17/3202 463/20 |

(Continued)

FOREIGN PATENT DOCUMENTS

| | | |
|---|---|---|
| WO | 2017/218367 | 12/2017 |
| WO | 2019/178114 | 9/2019 |

OTHER PUBLICATIONS

Bruno R. De Araujo, et al., "Mockup Builder: Direct 3D Modeling on and Above the Surface in a Continuous Interaction Space", Graphics Interface Conference 11 , 2018 IEEE Conference on Virtual Reality and 3D User Interfaces (VR), IEEE, Mar. 18, 2018 (Mar. 18, 2018), pp. 320-326, XP033394602, (Continued)

*Primary Examiner* — Parul H Gupta
(74) *Attorney, Agent, or Firm* — Oblon, McClelland, Maier & Neustadt, L.L.P.

(57) ABSTRACT

A computer-implemented method for selecting a face among faces of a 3D object in a 3D immersive environment. Each face is oriented in the 3D immersive environment. The method comprises displaying the 3D object in the 3D immersive environment. The method further comprises detecting S20 a hand gesture. The hand gesture comprises an adduction of all fingers except thumb. The method further comprises determining an oriented plane formed with the palm and/or the back of the hand in the 3D immersive environment. The method further comprises identifying the face of the 3D object having the closest orientation with the oriented plane. This constitutes an improved method for selecting a face among faces of a 3D object in a 3D immersive environment using hand interactions.

20 Claims, 11 Drawing Sheets

(56) References Cited

U.S. PATENT DOCUMENTS

| | | | | |
|---|---|---|---|---|
| 2013/0268893 A1* | 10/2013 | Maeda | .................. | G06F 3/0482 715/810 |
| 2015/0220149 A1* | 8/2015 | Plagemann | ............. | G06F 3/017 715/856 |
| 2015/0234471 A1 | 8/2015 | Niinuma | | |
| 2019/0146599 A1 | 5/2019 | Gunnarsson et al. | | |
| 2019/0146660 A1 | 5/2019 | Holz et al. | | |

OTHER PUBLICATIONS

Bret Jackson, et al., "Yea Big, Yea High: A 3D User Interface for Surface Selection by Progressive Refinement in Virtual Environments", Department of Mathematics, Statistics, & Computer Science Macalester College, 2018 IEEE Conference on Virtual Reality and 3D User Interfaces, pp. 320 326.

Daniel Leithinger et al., "Direct and Gestural Interaction with Relief, Proceedings of the 24th Annual ACM Symposium on User Interface Software and Technology", : Oct. 16-19, 2011, Santa Barbara, CA, USA, ACM, New York, NY, Oct. 16, 2011 (Oct. 16, 2011), pp. 541-548, XP058006154

Anonymous:, "Selecting—Blender Manual 11", web.archive.org, Nov. 22, 2019 (Nov. 22, 2019), XP055692231.

Rafael Radkowski et al: "Interactive Hand Gesture-based Assembly for Augmented Reality Applications", Jan. 30, 2012 (Jan. 30, 2012), pp. 303-308, XP055234236, Retrieved from the Internet: URL:http://citeseerx.ist.psu.edu/viewdoc/download?doi=10.1.1.469.9714&rep=repl&type= pdf [retrieved on Dec. 7, 2015] .

European Search Report dated Jun. 19, 2020, corresponding to European application No. 19306790.7. Cited Refs therein AA, AO, AP, and AU-AX.

New Application, Herewith, N/A, Fivos Doganis.

Non-Final Office Action dated Jun. 8. 2022, issued in related U.S. Appl. No. 17/136,912 (citing documents AA and AB).

* cited by examiner

SELECTION OF A FACE WITH AN IMMERSIVE GESTURE IN 3D MODELING

CROSS-REFERENCE TO RELATED APPLICATIONS

This application claims priority under 35 U.S.C. § 119 or 365 to European Application No. 19306790.7, filed Dec. 30, 2019. The entire contents of the above application(s) are incorporated herein by reference.

FIELD

The disclosure relates to the field of computer programs and systems, and more specifically to a method for selecting a face among faces of a 3D object in a 3D immersive environment.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role in the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. Altogether, the system delivers an open object model linking products, processes, resources to enable dynamic, knowledge-based product creation and decision support that drives optimized product definition, manufacturing preparation, production and service.

CAD applications allow creating accurate 3D objects interactively. A 3D object is considered as accurate when the 3D object reproduces faithfully a corresponding real object. One criteria is to minimize the differences between the envelopes of the 3D object and the real object. Therefore, 3D objects created with CAD applications traditionally contain many small topological elements for the rough parts of the 3D objects. Several approaches for selecting the topological elements of interest for the design have been implemented. Traditionally, mouse-based approaches are used.

Here a small topological element may be defined as an element with a small visible surface. In a mouse based approach, a small topological element may be defined as an element with a small clickable surface. In other words, a small topological element in a mouse based approach is difficult to select because users need to be really precise to define the mouse position. The topological elements may also often overlap and/or be partially or totally occluded. Therefore even if the topological elements are not small, their clickable surface with a mouse-based approach may be small or even zero.

In a 3D application, a well-known problem is the ambiguity about which element users want to select. In a CAD application, mouse-based approaches tend to select the smallest element pointed by the cursor but this does not solve the ambiguity completely. In order to reduce this ambiguity, a well-known solution is to let users specify which type of topological element they want to select. Using this information, the elements are filtered by type during selection. This solution is time consuming and needs to display the various filters available for example in a 2D panel. Another problem during selection of elements is to reduce the number of mandatory clicks needed to select one element. For example, it is often necessary to zoom in on the zone of interest to select the element of interest of a 3D object. Changing the point of view of the 3D scene is also necessary when the element of interest is occluded. These two cases need several actions from user and are time consuming.

Recently, hand interactions are gaining importance in 3D design applications. Indeed, recent advances in immersive technologies have made full hand tracking widely available, in Virtual Reality (VR), in Augmented Reality (AR) and in Mixed Reality (MR). Virtual Reality is a 3D immersive environment which may be defined as an artificial environment that is created with software and presented to the user in such a way that the user suspends belief and accepts it as a real environment. In Virtual Reality (VR), the users' perception of reality is completely based on virtual information. Augmented Reality (AR) and Mixed Reality (MR) differ from Virtual Reality (VR) in the sense that the 3D immersive environment is constituted by the surrounded environment which is actually real and by some layers of virtual objects added to the real environment. In Augmented Reality (AR) and Mixed Reality (MR), user is provided with additional computer generated information that enhances their perception of reality. On the other hand, in Virtual Reality (VR) the surrounding environment is completely virtual. A difference between Augmented Reality and Mixed Reality is that the user cannot interact directly with virtual objects in Augmented Reality (AR). In Mixed Reality, the additional computer generated information are "mixed" together to create a realistic environment. A user may navigate this environment and interact with both real and virtual objects.

For example, Augmented Reality (AR) has the capability to display a virtual 3D box on a physical table. With Mixed Reality (MR), the user might be able to pick up and open the box.

In the definitions of Virtual, Augmented and Mixed Reality, a real object is an object which exists physically in the environment world.

None of the existing CAD applications allows the creation of accurate 3D objects, in an immersive environment, using natural hand interactions.

Within this context, there is still a need for an improved method for selecting by use of hand gestures topological elements such as faces of a 3D object in a 3D immersive environment of a CAD system.

SUMMARY

It is therefore provided a method for selecting a face among faces of a 3D object in a 3D immersive environment. Each face is oriented in the 3D immersive environment. The method comprises displaying the 3D object in the 3D immersive environment. The method further comprises detecting a hand gesture. The hand gesture comprises an adduction of all fingers except thumb. The method further comprises determining an oriented plane formed with the palm and/or the back of the hand in the 3D immersive environment. The method further comprises identifying the face of the 3D object having the closest orientation with the oriented plane.

Such a method constitutes an improved method for the creation of accurate 3D objects, in an immersive environment, using hand interactions.

The method may comprise one or more of the following:
each face of the 3D object and the oriented plane further have a normal and wherein the identifying (S40) further comprises identifying the face of the 3D object having a closest direction between the normal of said face and the normal of the oriented plane.
each face of the 3D object and the oriented plane further have a position in the 3D immersive environment, and wherein the identifying (S40) further comprises:
minimizing a function $f$:

$$f(\text{Face}) = w_1 * \|FH\| + w_2 * \widehat{FH}$$

wherein:
Face is the face of interest;
$\{w_1 \in \mathbb{R} \,|\, w_1 \geq 0\}$ and $\{w_2 \in \mathbb{R} \,|\, w_2 \geq 0\}$ and $\{w_1 + w_2 > 0\}$;
$\|FH\|$ is an Euclidian distance in the 3D immersive environment between the position of the face Face and the position H of the oriented plane of the hand; and
$\widehat{FH}$ is an angle in the 3D immersive environment between the normal of the face Face and the normal of the oriented plane of the hand.
the term $\|FH\|$ of the function $f$ is replaced by $\|FH'\|$ with H' being computed by:

$$H' = E + EH * \max(1, a * (\|EO_{max}\|) / \|EH_{max}\|)$$

wherein:
H' is the position of the oriented plane of a virtual hand;
E is the position of the user's point of view;
H is the position of the oriented plane of the user's hand;
EH is a vector from E to H;
Omax is the position of the furthest face of the 3D object from E;
Hmax is the furthest position of the center of the user's hand from E in a transverse plane of the user's body;
$\{a \in \mathbb{R}^*\}$;
$\|EO_{max}\|$ is the norm of the vector from E to Omax; and
$\|EH_{max}\|$ is the norm of the vector from E to Hmax;
the term $\|FH\|$ or $\|FH'\|$ of the function $f$ further comprises the Euclidean distance in the 3D immersive environment between the position of the face and at least one intersection of the 3D model with a ray being cast from the center of the head or the dominant eye or the point between the eyes to the center of the 3D model.
the identifying (S40) comprises:
determining (S400) the face of the 3D object having the closest orientation with the oriented plane;
computing (S410) one or more n-neighboring faces of the determined face, the one or more neighbor faces and the determined face forming a subset of selectable faces; and
identifying (S420) the face of the 3D object having the closest orientation with the oriented plane from the subset of selectable faces.
modifying a first rendering of the faces of subset of selectable faces.
modifying a second rendering of the identified face.
the faces of the 3D objects may be triangles and/or quadrangles and/or topological faces and/or parametric surfaces and/or procedural surfaces.
the detecting (S20) the hand gesture comprises an adduction of all fingers except thumb and an abduction of the thumb.
selecting the identified face of the 3D object by detecting that the hand gesture further comprises an adduction of the thumb.
detecting that the hand gesture further comprises an abduction of all fingers except thumb and deselecting the selected face.
the detecting of the hand gesture further comprises:
detecting an extension of the proximal and distal interphalangeal joints of all fingers except thumb; and/or
detecting an extension of the metacarpophalangeal joint of all fingers except thumb; and/or
detecting the hand gesture further comprises detecting that all side by side fingers except thumb are substantially in contact.

It is further provided a computer program comprising instructions for performing the method.

It is further provided a system comprising a display and a processing circuitry communicatively coupled with memory, the memory storing the computer program.

BRIEF DESCRIPTION OF THE DRAWINGS

Embodiments will now be described, by way of non-limiting example, and in reference to the accompanying drawings, where.

DETAILED DESCRIPTION

Figure 1:
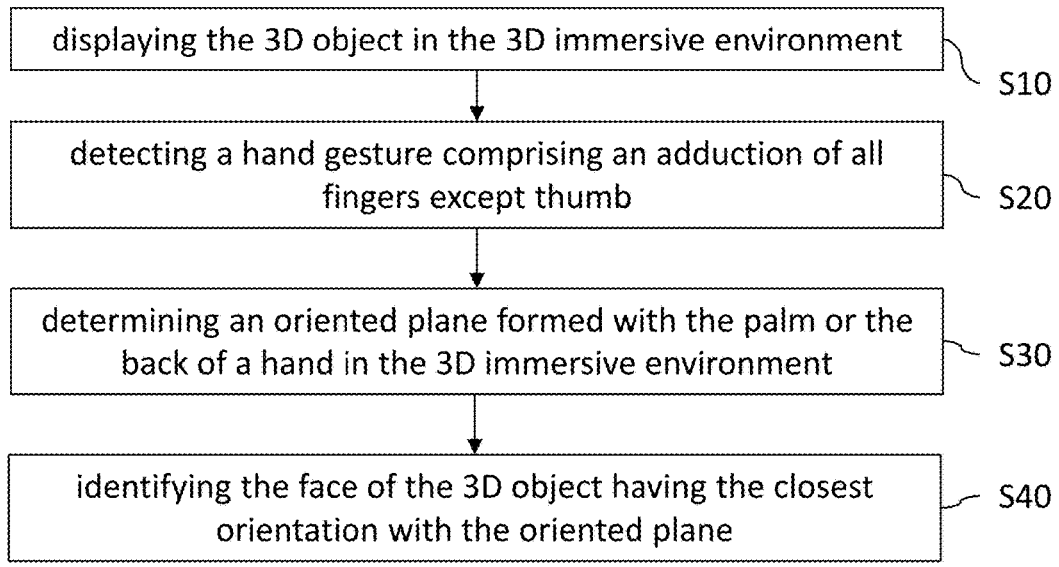
FIG. 1 shows an example of a flowchart of the method.

With reference to the flowchart of FIG. 1, it is described a computer-implemented method for selecting a face among faces of a 3D object in a 3D immersive environment. Each face is oriented in the 3D immersive environment. The method comprises displaying S10 the 3D object in the 3D immersive environment. The method further comprises detecting S20 a hand gesture. The hand gesture comprises an adduction of all fingers except thumb. The method further comprises determining S30 an oriented plane formed with the palm and/or the back of the hand in the 3D immersive environment. The method further comprises identifying S40 the face of the 3D object having the closest orientation with the oriented plane.

This constitutes an improved method for selecting a face among faces of a 3D object in a 3D immersive environment of a CAD system using hand interactions. Notably, the method solves the problem of the ambiguity about which element users want to select. As explained above, in CAD applications, 3D objects contains many small elements. Selecting an element might be difficult with a mouse based approach because of the size of the element or of the size of the visible surface of the element from the user's point of view. Indeed, if the size is small, with a mouse-based approach a user needs either to move their mouse really precisely and/or to zoom-in and/or to change the point of view of the 3D scene. The method presented here solves this drawback. Indeed, the method is using the orientation of the plane of the back and/or the palm of the hand during a hand gesture to determine which element the user wants to select. The method may also combine the orientation of the plane of the back and/or the palm of the hand with the position of the hand during the hand gesture of the user to determine which element the user wants to select. By using a combination of a position and an orientation, all elements of a 3D object may be differentiated and therefore selected by the user with the method.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

For example, the detecting S20 and the determining S30 partially depend on a user action. The detecting S20 is performed as a result of a user action that comprises a user hand gesture with an adduction of all fingers except thumb. The determining S30 is performed as a result of a user action that comprises a user hand gesture where an oriented plane is formed with the palm and/or the back of the user's hand.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

Figure 3:
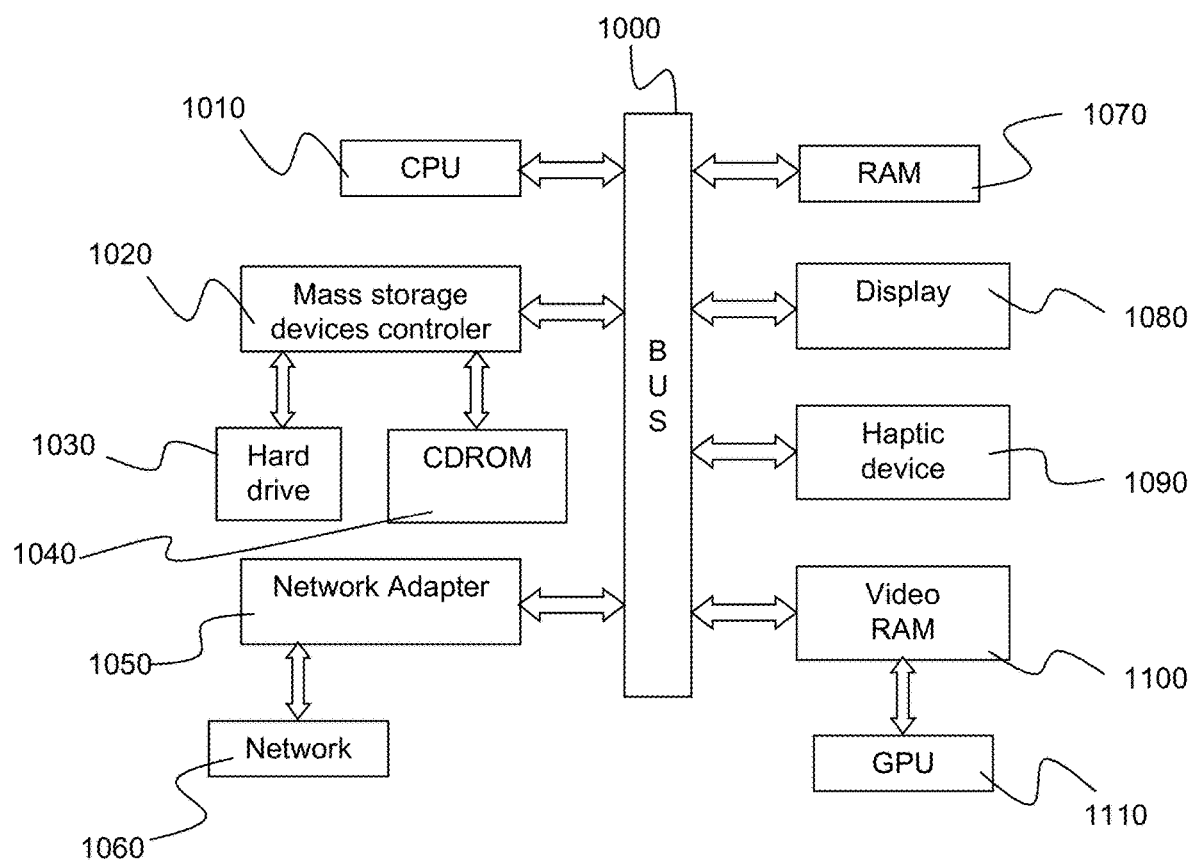
FIG. 3 shows an example of the system.

FIG. 3 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

The method manipulates 3D objects. Hereafter, any reference to a 3D object will refer to a digitally modeled 3D object, and not to a physical one. A digitally modeled 3D object may represent the geometry of a product to be manufactured in the real world subsequent to the completion of its virtual design with for instance a CAD software solution or CAD system, such as a (e.g. mechanical) part or assembly of parts (or equivalently an assembly of parts, as the assembly of parts may be seen as a part itself from the point of view of the method, or the method may be applied independently to each part of the assembly), or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. A 3D modeled object herein may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

A 3D object is composed of at least the following three types of topological entities: face, edge, and vertex. By definition, a face is a bounded portion of a surface. An edge is a bounded portion of a curve. A vertex is a point in 3D space. They are related to each other's as follows. The bounded portion of a curve is defined by two points (the vertices) lying on the curve. The bounded portion of a surface is defined by its boundary, this boundary being a set of edges lying on the surface. Edges of the face's boundary are connected by sharing vertices. Faces are connected by sharing edges. Two faces are adjacent if they share an edge. Similarly, two edges are adjacent if they share a vertex. All edges of a face may be lying on a same plane or not. A normal of a face may be calculated by taking the vector cross product of two edges of that face. If not all edges of a face are lying on a same plane, it is worth noting that various normal may be computed depending on the edges chosen to calculate the cross product. The normal may also be edited. For example, in case of a face having all edges not lying on a same plane, the normal is often edited. The normal gives the direction of the face. In other words, the normal determines the front side and the backside of a face. Traditionally, for a 3D object, the normal of its faces is directed towards the outside of the 3D object. For the sake of simplicity, we will consider it is the case from now on, being understood the method of the present disclosure might be performed with normals of the faces of a 3D object that are directed towards the inside of the 3D object. The orientation of the face may be deducted from the direction of the face. The orientation of the said face is materialized by a line parallel to its normal. The orientation of this line of a face may also be edited. A face has also a position. The position of a face may be given by its centroid. The position of a face may also be edited.

From now on, we assume all orientations, directions and positions are computed in the 3D immersive environment's reference frame.

The 3D object may also be defined using edges or lines, in certain cases with faces or surfaces. Lines, edges, or surfaces may be represented in various manners, e.g. non-uniform rational B-splines (NURBS). These edges, lines, and/or surfaces may be used as inputs from which a geometry of the 3D object may be generated, which in turn allows for a representation of the 3D object to be generated. The method described here may be used on 3D object based on non-uniform rational B-splines (NURBS) lines, edges and surfaces. More generally, surfaces may also be parametric and/or procedural surfaces. A parametric surface is a surface in the Euclidean space $\mathbb{R}^3$ which is defined by a parametric equation with two parameters $\vec{r}: \mathbb{R}^2 \to \mathbb{R}^3$. A procedural surface is a surface which is defined as a procedure. A subdivision surface may be considered as a procedural surface. A subdivision surface is a method of representing a smooth surface via the specification of a coarser piecewise linear polygon mesh.

Referring now to FIG. 1, the method displays S10 at least one 3D object in a 3D immersive environment. If there are more than one 3D object displayed in the 3D immersive environment, there is one 3D object identified as a 3D object of interest. From now on, the 3D object of interest is referred to as the 3D object.

As defined above, a 3D immersive environment may be used in Virtual, Augmented or Mixed Reality. This 3D immersive environment has a reference frame. All objects, and all their topological elements, in this 3D immersive environment may therefore be located relatively to this reference frame. The method may then be used in Virtual, Augmented and Mixed Reality to select a face of any of the 3D object of a 3D immersive environment. The method could also be used in any other Reality comprising an environment with a reference frame allowing the localization of at least one 3D object.

Then, a hand gesture is detected S20. The hand gesture comprises an adduction of all fingers except thumb.

The user's interactions with the 3D immersive environment may be done by tracking a position and an orientation of a part of the body of the user, or by tracking respective positions and orientations of several parts of the user's body, or even tracking positions and orientations of the complete user's body.

In examples, parts of the user's body are the hand(s) of the user.

Hand tracking provides direct and natural interactions and improves the immersive experience. Indeed the user does not need to use specific Virtual, Mixed or Augmented Reality hand controllers. Traditionally, to interact with a 3D object in a 3D immersive environment, a method comprises clicking on a button of the specific controller after pointing at the 3D object with a virtual 3D line.

Figure 7:
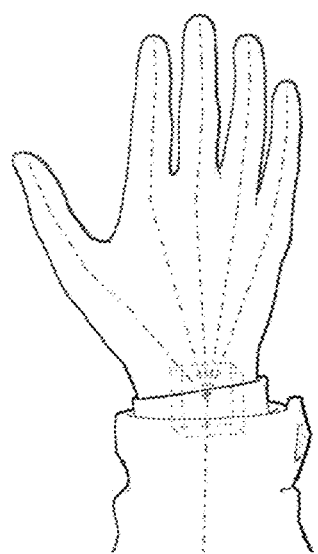
FIG. 7 shows an example of posteroanterior view of a virtual skeleton of a right hand in a default posture.
Figure 8:
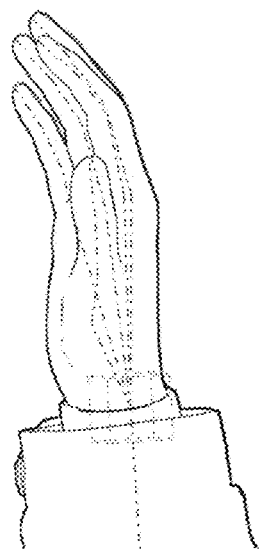
FIG. 8 shows an example of a lateral view of a virtual skeleton of a right hand in a default posture.

Hand tracking allows a detection of specific postures or gestures of a hand. For example, hand tracking of specific postures may be done with a video recorder or with gloves and hand tracking of specific gestures may be done with accelerometers. The method may be used with the right or the left hand of the user. A posture is a pose using a part of the body and a gesture here may be defined as a movement allowing a part to modify its posture. In other words, a second posture may be seen as the result of a gesture started from a first posture. Therefore detecting a gesture may be done by detecting a second posture and comparing this second posture with a first posture. If the detected second posture is the same than the first posture, no gesture happened. If the detected posture is different from the first posture, the gesture may be defined as the difference between the second posture and the first posture. More generally, a gesture may be defined as a change of posture triggered by a change of position and/or orientation of a part of the user's body, e.g. the user's hand. For example, in the method, detecting a hand gesture could consist of computing a difference of the current posture from the default posture. In this example, the default posture corresponds the first posture and the current posture to the second posture. The difference may be inferred with a change of position and/or orientation of the user's hand. It is worth noting that hand tracking of specific postures is performed with devices capturing a posture at a high framerate, for example at least 10 frames per second, therefore the risk of not detecting a motion involving a motion from a first posture to a first posture with an intermediate second posture is really low. The default posture could be any posture allowing the detection of an adduction of all fingers except the thumb. An example of a default posture for a right hand is shown in FIG. 7 and FIG. 8. This default posture is an example of a common posture for a resting right hand. In other words, the default posture is an example of a posture for a right hand in which all muscles are relaxed. A default posture could also be defined as any posture, which will not be detected as a specific posture used in any step of the method. From now on, for the sake of explanation only, all gestures will be defined as a difference of the default posture shown in FIGS. 7 and 8.

The detection of a gesture may be done in various ways. In an example, gestures may be detected by mathematical comparison of the relative positions and/or orientations of various parts of the body, with some tolerance to take into account morphological variations. Note that a calibration phase might be required for the system to adjust to the morphology of the user. In another example, gestures may also be detected using machine learning techniques, by training a neural network to distinguish the different possible gestures.

Figure 5:
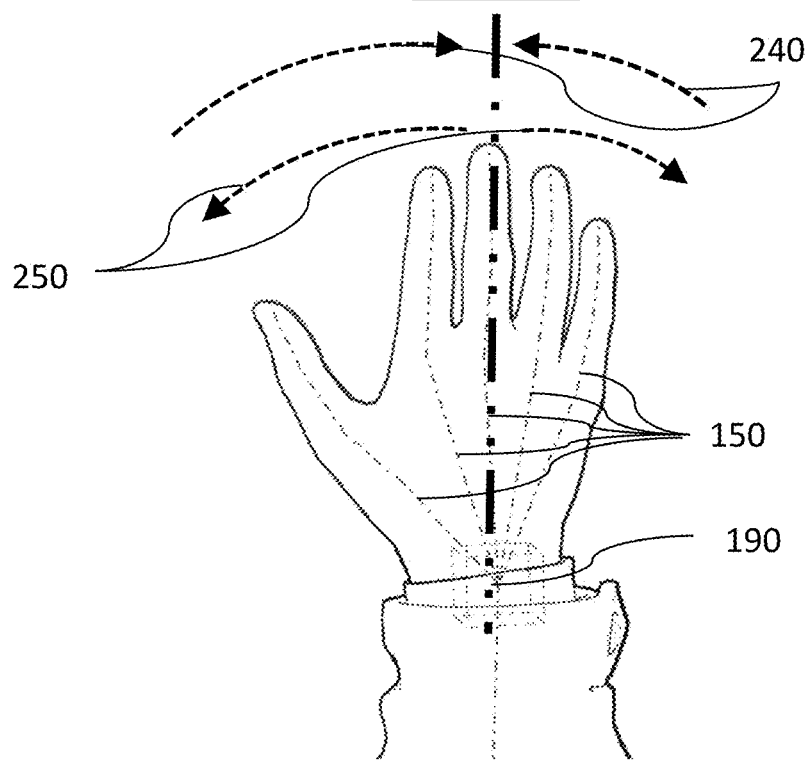
FIG. 5 shows an example of directions of fingers abduction and adduction in a posteroanterior view of a virtual skeleton of a right hand in a default posture.

In examples, kinematic parameters of the gesture of the hand may be provided through a virtual skeleton 150 as shown for example in FIG. 5. A virtual skeleton comprises one or more joints and one or more bones. This virtual skeleton does not need to replicate a real skeleton. In other words, there might be no correspondence between the joints and the bones of the virtual skeleton with the joints and the bones of the real skeleton. For example, the virtual skeleton of a hand might have less or more joints than the real skeleton of a hand. Furthermore, even if each joint of the virtual skeleton corresponds to a joint of the real skeleton, their position and orientation might vary. By using the linear and angular speed, position and orientation of the joints of the virtual skeleton, it is possible to detect a gesture or a posture of the real skeleton. For the sake of simplicity, in the later we will consider that the virtual skeleton replicates the real skeleton of the hand.

It is worth noting that the method of the disclosure is independent to the detecting method used to detect the various postures described. Hence, any technology able to detect a change of posture (e.g. a change of position and/or orientation of a part of the user's body), based or not on a virtual skeleton, may be used.

Figure 4:
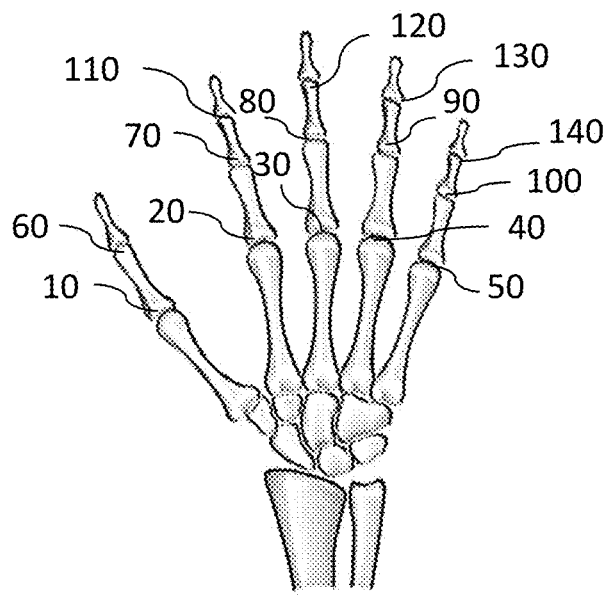
FIG. 4 shows an example of a posteroanterior view of a skeleton of a right hand in a default posture.

An example of real skeleton of a hand is shown in FIG. 4. A hand contains five fingers, which are traditionally called: thumb, index finger, middle finger, ring finger and little finger. The thumb is composed of the metacarpophalangeal 10 and interphalangeal 60 joints. The index finger is composed of the metacarpophalangeal 20, proximal interphalangeal 70 and distal interphalangeal 110 joints. The middle finger is composed of the metacarpophalangeal 30, proximal interphalangeal 80 and distal interphalangeal 120 joints. The ring finger is composed of the metacarpophalangeal 40, proximal interphalangeal 90 and distal interphalangeal 130 joints. The little finger is composed of the metacarpophalangeal 50, proximal interphalangeal 100 and distal interphalangeal 140 joints. The rest of the hand may be divided in three areas. A first area is the palm, which is the central region of the anterior part of the hand. A second area is the back of the hand, which is the corresponding area of the palm on the posterior part of the hand. A third area is the heel of the hand located in the proximal part of the palm.

Adduction is the gesture of a body part toward the body's midline. As shown in the example of FIG. 5, for fingers except thumb, adduction is the gesture moving each of the fingers toward a line 190. As an example shown in FIG. 5, this line 190 may be defined by the center of gravity of the hand and the longitudinal axis of the hand. The adduction 240 of all fingers except thumb is an adduction of the metacarpophalangeal joints 20, 30, 40, 50 of respectively index finger, middle finger, ring finger and little finger. This gesture is the result of a contraction of muscles including the palmar interosseous muscles. The adduction 240 of thumb moves the thumb away from the line 190 by moving the thumb into the plane of the palm of the hand. The adduction 240 of the thumb is an adduction of the metacarpophalangeal joint 10. The adduction of thumb is the result of a contraction of muscles including the adductor pollicis muscle.

Figure 6:
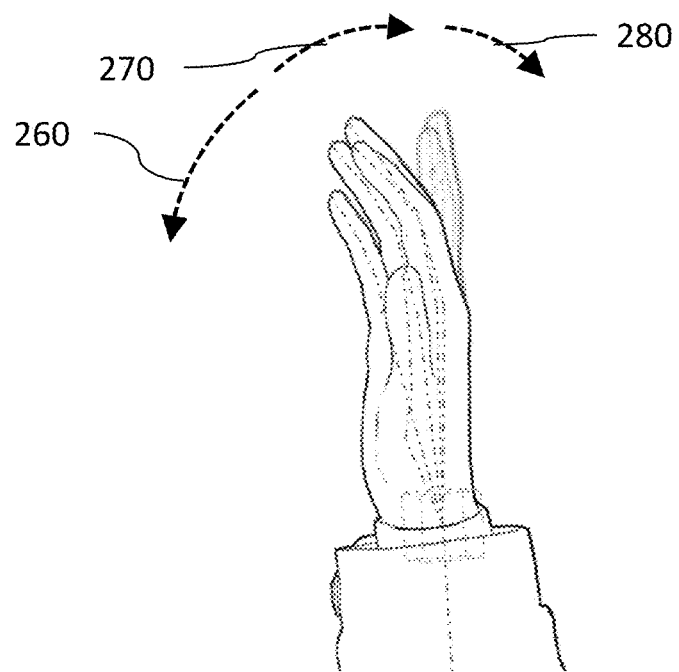
FIG. 6 shows an example of directions of fingers flexion, extension and hyperextension in a lateral view of a virtual skeleton of a right hand in a default posture.

As shown in the example of FIG. 6, flexion 260 is the gesture moving index finger, middle finger, ring finger and little finger from the line 190 and moving them towards the palm of the hand. Extension 270 is the gesture moving index finger, middle finger, ring finger and little finger towards the line 190 and moving them away from the palm of the hand. Hyperextension 280 is the gesture moving index finger, middle finger, ring finger and little finger away from the line 190 and moving them towards the back of the hand. These three gestures involve metacarpophalangeal joints 20, 30, 40, 50, proximal interphalangeal joints 70, 80, 90, 100 and distal interphalangeal 110, 120, 130, 140 of respectively index finger, middle finger, ring finger and little finger. The extension is the result of a contraction of muscles including the extensor digitorum muscles and the dorsal and palmar interossei muscles and lumbricals muscles of the hand. Adduction of the thumb is the gesture bringing the thumb towards the palm of the hand. Adduction of the thumb is mainly produced by the adductor pollicis. Adduction of the thumb may also bring the thumb towards the side of the palm and index finger. Abduction of the thumb is the gesture bringing the thumb away from the palm of the hand. Abduction of the thumb may also bring the thumb away from the side of the palm of the hand and index finger. Adduction of the thumb is partly produced by the abductor pollicis longus. Adduction and abduction of the thumb involve metacarpophalangeal joint 10 of thumb. Flexion of the thumb moves the thumb towards the line 190. Flexion of the thumb is mainly produced by flexor pollicis brevis muscle. Extension thereof moves the thumb away from the line 190. Extension of the thumb is mainly produced by extensor pollicis longus muscle. Adduction, abduction, flexion and extension of the thumb involve metacarpophalangeal joint 10 of thumb.

Referring back to FIG. 1, after detecting S20 a hand gesture comprising an adduction of all fingers except thumb, the method comprises determining S30 an oriented plane formed with the palm and/or the back of the hand. Determining S30 an oriented plane is based on evaluating the orientation of the palm and/or the back of the hand. The palm and/or the back of the hand may be considered as a flat surface when all fingers except thumb are adducted. Therefore, it is possible to consider the back of the hand as a plane when all fingers except thumb are adducted. In order to approximate the orientation of the palm and/or the back of the hand when all fingers except thumb are adducted by using the normal of any points of the plane or by using the position of three points of the plane in order to compute the normal of the plane with a cross product.

Figure 18:
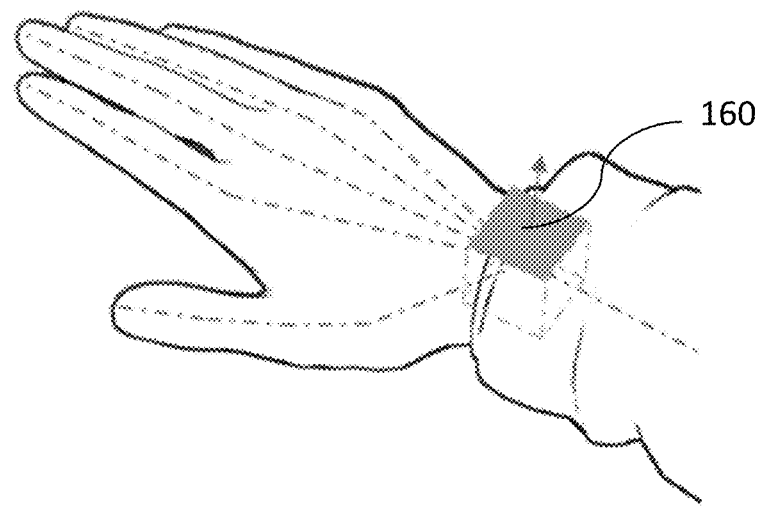

It is now discussed FIG. 18. FIG. 18 shows an example of the determining S30 by using the orientation of the wrist joint 160 of the virtual skeleton 150. Indeed, the wrist joint 160 of the virtual skeleton 150 is a point of the oriented plane representing the palm and/or the back of the hand, therefore the orientation of the wrist joint 160 is the orientation of the orientated plane.

Figure 19:
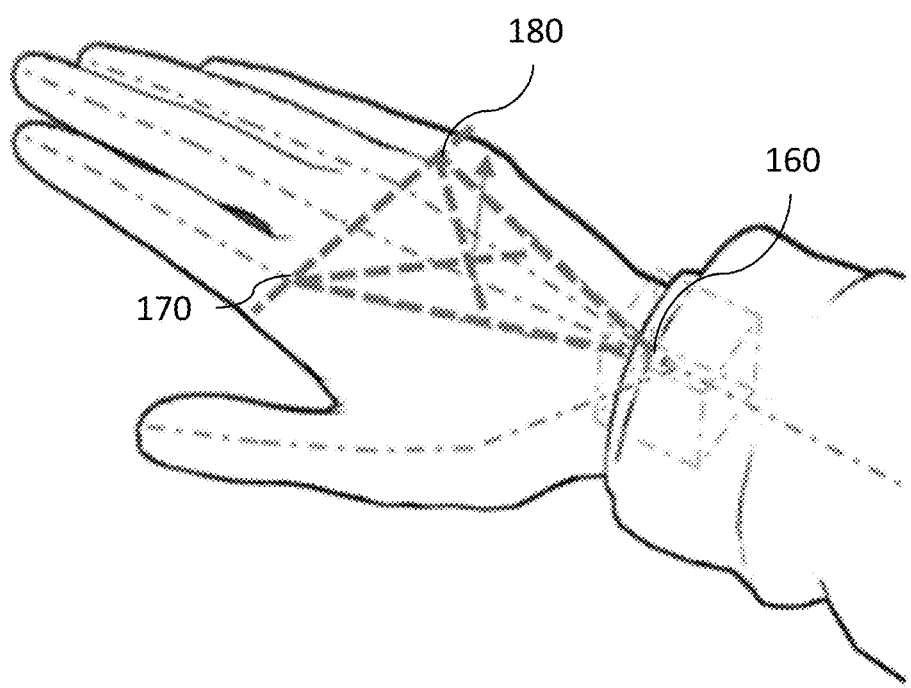

FIG. 19 shows another example of the determining S30 based on the position of the wrist joint 160, the position of the metacarpophalangeal joint 170 of index finger and the position of the metacarpophalangeal joint 180 of little finger. The three positions form a triangle. A normal of a triangle may be calculated by taking the vector cross product of two sides of that triangle. The normal gives the direction of the palm and/or the back of the hand, depending on the sides chosen to calculate the cross product. The normal depends also on the order these sides are used to calculate the cross product. The orientation of a triangle may be materialized by a line perpendicular to the plane on which all corners of the triangle are lying. The orientation of a triangle may also be edited and therefore not perpendicular to the plane.

Determining S30 may also be done without any virtual skeleton. As an example, determining S30 may be based on a neural network trained to determine S30 from a video recorder.

Using the palm and/or the back of the hand to allow the users to provide an orientation to the system makes the method more reliable. Indeed the relative planarity of these areas is slightly determined by the gestures of the hand. Furthermore, these areas are the largest surfaces of the hand, which increases the reliability of the determination of their orientation. The position of the palm and/or the back of the hand may be for example located at the wrist joint 160 or the centroid of the triangle formed by the wrist joint 160, the position of the metacarpophalangeal joint 170 of index finger and the position of the metacarpophalangeal joint 180 of little finger.

Then, the method further comprises identifying S40 the face of the 3D object having the closest orientation with the oriented plane. It is to be understood that each face of the 3D object defines a plane, and the closest orientation with the oriented plane is determined by a comparison between the oriented plane and each (or at least a part of) of the planes formed by the faces. Examples of determination of the closest orientation will now be discussed.

As an example, the orientation of each face may be materialized by a line. For each face, the angle between the line representing its orientation and the line representing the orientation of the plane formed with the palm and/or the back of the hand is computed. The face having the smallest value angle is the face of the 3D object having the closest orientation with the oriented plane. Here we consider that all angles are defined between [0; 2PI].

In examples of the present disclosure, the identifying S40 may be done iteratively by considering each face of the 3D object. It is to be understood that only a subset of faces of the 3D object may be used when determining the face of the 3D object having the closest orientation with the oriented plane. For instance, only the closest faces (e.g. according to an Euclidian distance) to the user's hand may be used.

Using the orientation to select a face among faces of a 3D object accelerates the selection of a face of interest. Using the orientation to select a face among faces of a 3D object also reduces the ambiguity of which face the user wants to select. Indeed, an accurate 3D object is a digitally modeled 3D object, which replicates a physical one with a very high precision. For example, an accurate 3D model will commonly have many small faces to replicate a rough surface and large faces to replicate a flat surface. In this case, adjacent faces of an accurate 3D object have a significant orientation difference. Therefore, by using the orientation to select a face among faces of a 3D object, the method is especially useful if 3D objects have many small faces, which is the case for accurate 3D objects.

In examples, the identifying S40 may comprise identifying the face of the 3D object having a closest direction between the normal vector of said face and the normal vector of the oriented plane. For example, the identifying S40 may be performed iteratively by considering each face or a subset of faces of the 3D object. For each face considered, the angle between its normal vector and the normal vector of the oriented plane is computed. The face having the smallest value angle is the face of the 3D object having the closest direction with the oriented plane. Here we consider that all angles are defined between [0; 2PI].

Figure 14:
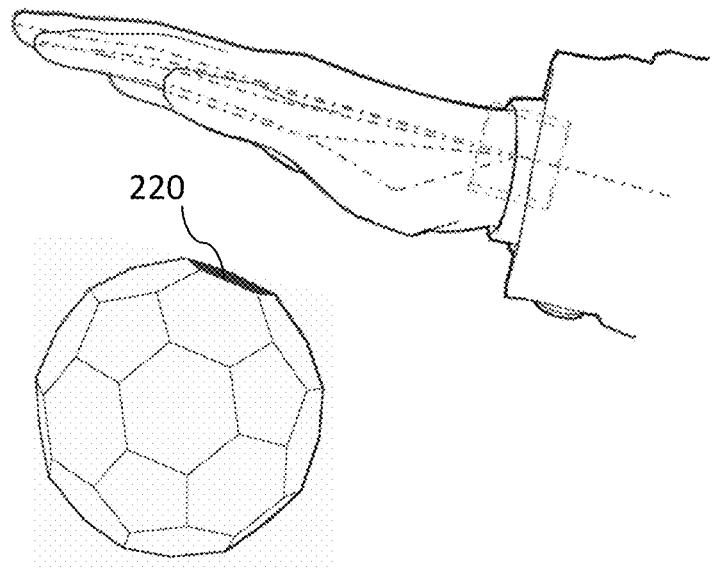
Figure 15:
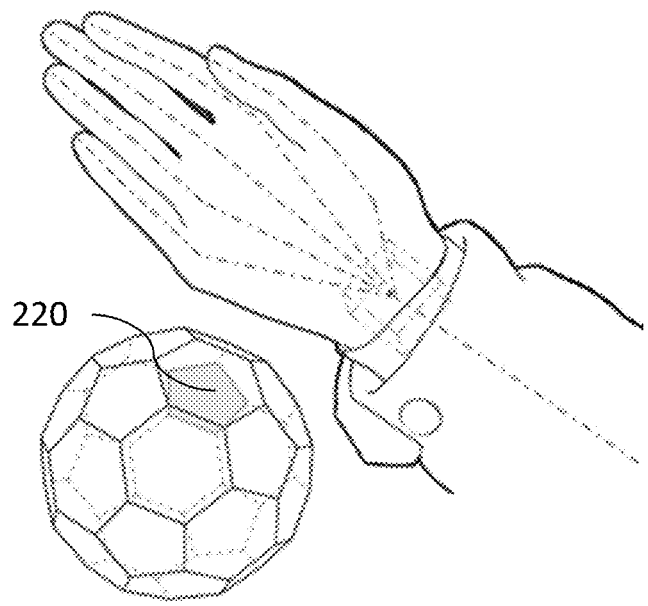

By using the direction instead of the orientation during the identifying S40, the ambiguity of which face the user wants to select is even more reduced. Indeed, if two faces have an opposite direction with one of these faces having its normal parallel to the normal of the oriented plane, using the direction instead of the orientation during the identifying S40 removes the ambiguity of which the user wants to select. As illustrated in FIG. 15, using the direction to select a face among faces of a 3D object is particularly useful to select a face 220 situated at the back of the object from the user's viewpoint. As an example, here the direction of the oriented plane of the back of the hand is used during the identifying S40. Therefore, by turning the palm of their right hand towards their head, the method allows them to select a face situated at the back of the object from the user's viewpoint. FIG. 14 shows a 3D object from the user's point of view. As illustrated in FIG. 14, using the direction to select a face among faces of a 3D object is also particularly useful to select a face 220 having a small visible surface from the user's point of view.

In examples, the identifying S40 may comprise identifying the face among faces, which minimizes a function noted $f$ computed with the following equation (1):

$$f(\text{Face}) = w_1 * \|FH\| + w_2 * \widehat{FH} \tag{1}$$

wherein:
Face is the face of interest;
$\{w_1 \in \mathbb{R} \mid w_1 \geq 0\}$ and $\{w_2 \in \mathbb{R} \mid w_2 \geq 0\}$ and $\{w_1 + w_2 > 0\}$;
$\|FH\|$ is an Euclidian distance in the 3D immersive environment between the position of the face Face and the position H of the oriented plane of the hand; and $\widehat{FH}$ is an angle in the 3D immersive environment between the normal of the face Face and the normal of the oriented plane of the hand.

The function $f$ is a weighted sum of two terms. Indeed, the first term $\|FH\|$ is multiplied by a factor $w_1$ and the second term $\widehat{FH}$ is multiplied by a factor $w_2$.

The first weighted term $\|FH\|$ is the Euclidian distance in the 3D immersive environment between the position of the face Face and the position H of the oriented plane of the palm and/or the back of the hand. For example, the position of the face Face may be located at the centroid of the face. The position of the oriented plane of the palm and/or the back of the hand may be, as an example, located at the position of the wrist joint 160 of the virtual skeleton.

The second weighted term $\widehat{FH}$ is the angle between the normal vector of the face Face and the normal vector of the oriented plane of the palm and/or the back of the hand. The second weighted term could also be based on the orientation of the face Face and the orientation of the oriented plane of the palm and/or the back of the hand instead of using their directions.

Each weight $w_1$ and $w_2$ may be equal or superior to 0. The sum of the two weights is strictly superior to 0. If one of the weight is equal to 0, it means only one of the two terms is considered in the function. As an example, $w_1$ may be set between 0.1 and 0.5 and $w_2$ may be set between 0.5 and 0.9.

The weights $w_1$ and $w_2$ may be precomputed. For example, they may be precomputed based on the number and the size of the faces of the 3D object. The weights $w_1$ and $w_2$ may, for example, be precomputed at the loading of the 3D immersive environment containing the 3D object. If the 3D object has many small faces, the weight of the second term might be larger than the weight of the first term. The weights may also depend of the devices used. For example, some devices might give a limited precision for the position of the hands but a better precision for the orientation. The weights may also vary during the method. For example, the weights may vary depending on the number and the size of the faces of the 3D object of the surfaces of the 3D object located in the field of view of the user. The field of view may be defined as the extent of the observable environment at a given time. Therefore, because the field of view might vary during the method, the weights $w_1$ and $w_2$ may also vary.

In an example, the identifying S40 may be done iteratively by considering each face of the 3D object. In another example, the identifying S40 may be done iteratively by considering each face of a subset of the 3D object. For each face, the result of the function $f$ is computed. The face having the smallest value is the face of the 3D object minimizing the function $f$.

In examples, the term $|FH|$ of the function $f$ may be replaced by the term $\|FH'\|$. H' is computed using the equation (2) by:

$$H'=E+EH*\max(1,a*(\|EO_{max}\|)/\|EH_{max}\|) \qquad (2)$$

wherein:
  H' is the computed position of the center of a virtual hand;
  E is the position of the user's point of view;
  H is the position of the center of the user's hand;
  EH is a vector from E to H;
  Omax is the position of the furthest face of the 3D object from E;
  Hmax is the furthest position of the center of the user's hand from E in a transverse plane of the user's body;
  $\{a \in \mathbb{R} \,|\, a \geq 1\}$;
  $\|EO_{max}\|$ is the norm of the vector from E to Omax; and
  $\|EH_{max}\|$ is the norm of the vector from E to Hmax;
H' is the computed position of the oriented plane of a virtual hand. The virtual hand may be defined as the hand virtually located at least further than the user's hand from the user's point of view E in the 3D immersive environment. Using a virtual hand is useful in order to ensure the term $\|FH'\|$ is always pertinent regarding the distance of the faces from the user's point of view. The virtual hand may not be closer from the user's point of view E than the user's hand. The user's point of view E may be for example situated at the center of their head or at their dominant eye or the middle of their eyes. Omax is the position of the furthest face of the 3D object from the user's point of view E. As an example, the considered face as the furthest face of the 3D object from the user's point of view E may be determined at the beginning of the method, for example at the beginning of the detecting S20. As an example, the considered face as the furthest face of the 3D object from the user's point of view E may also be updated all along the method. Updating the considered face as the furthest face of the 3D object from the user's point of view E is especially useful if the user's point of view E and/or the 3D object moves during the method. In other words, as an example, Omax may be determined during the detecting S20 and may be updated during all along the method. Hmax is the furthest position of the oriented plane of the user's hand from the user's point of view E in a transverse plane of the user's body. Therefore Hmax is an indicator of whether or not a face is selectable by using the method considering the face's distance from the user's point of view E. Hmax is for example the position of the oriented plane of the user's hand when the user's arm is stretched out horizontally in front of them. Hmax may be precomputed for example during a calibration phase. Hmax may also be set by the user. a is used as a factor of $\|EO_{max}\|/\|EH_{max}\|$. a is for example set by the user before using the method. If a=1, it means the virtual hand will be further than the user's hand in the 3D immersive environment when the distance between the furthest face of the 3D object from the user's point of view E is greater than the furthest position of the oriented plane of the user's hand from the user's point of view E in a transverse plane of the user's body. Using a greater value than 1 for a will allow user to select the furthest face of the 3D object from the user's point of view E without having to stretch entirely their arm. As an example, a value of a may be set between 1.5 and 2. For the sake of simplicity, we will consider below that a=1.

Using a virtual hand improves the user's interactions with the 3D object (and more generally in the 3D environment). Examples of FIGS. 20 and 21 illustrate improvements in ergonomics with the use of the virtual hand.

Figure 20:
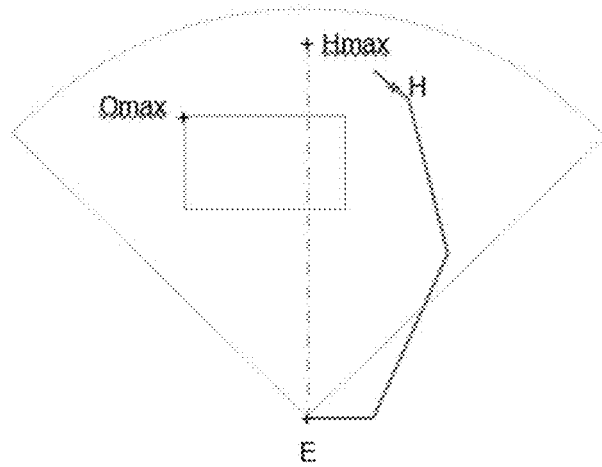

In the example of FIG. 20, using a virtual hand may allow a user to select any face of the 3D object without having to stretch entirely their arm. Maintaining an arm stretch may be tiring for the user, therefore using a virtual hand solves this problem.

Figure 21:
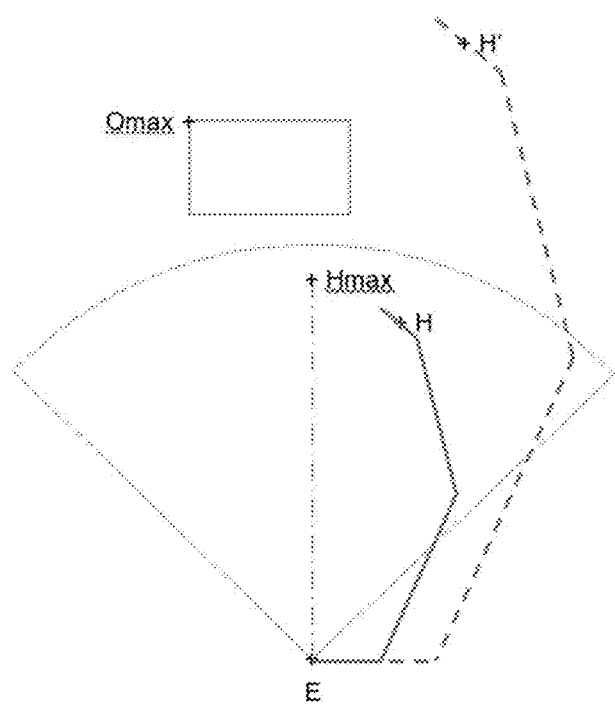

In the example of FIG. 21, using a virtual hand allows the user to select any face of the 3D object without moving the user's point of view E. Indeed, as an example, when the distance between the furthest face of the 3D object and the user's point of view E is greater than the distance between the furthest position of the center of the user's hand from E in a transverse plane of the user's body, some faces of the 3D object may not be selectable without using a virtual hand. In this case, the virtual hand is positioned further from the user's point of view E than the user's hand. Without using the virtual hand, the term $\|FH\|$ would penalize the selection of the furthest face of the 3D object from the user's point of view E. The method would therefore be biased by this term. The virtual hand solves this problem by virtually moving the position of the user's hand in the 3D immersive environment in order to ensure the virtual H' may always be at least as far as the furthest face of the 3D object with both positions considered from the user's point of view E.

In an example, using the virtual hand may be combined with a ray cast sent from the virtual hand. This combination may be activated for example if the user's hand is really close to the user's head. The direction of the ray may be orthogonal to the oriented plane or from the center of the palm/back of the virtual hand toward the center of the 3D object. This combination may be, for example really useful in Mixed or Augmented Reality to select any face of a 3D object which may be surrounded by real obstacles.

In examples, the term ||FH|| or ||FH'|| of the function $f$ (respectively computed with equation (1) or equation (2)) may further comprise the Euclidean distance in the 3D immersive environment between the position of the face and at least one intersection of the 3D model with a ray being cast from the user's point of view E. The ray may be cast for example from the center of the head or the dominant eye or the point between the eyes to the center of the 3D model. The direction of the cast may be for example defined by the direction of the user's gaze or user's head. The direction of the cast may also be for example computed from the position of the user's point of view E to the position of the center of the 3D model. The center of the 3D model may be for example defined as the center of the bounding box of the 3D model. As an example, the direction of the cast is calculated from the position of the user's point of view E to the position of the center of the 3D model.

Adding a term based on the Euclidean distance in the 3D immersive environment between the position of the face and at least one intersection of the 3D model with a ray being cast from the user's point of view E to the term ||FH|| or ||FH'|| allows the method to be sensitive to the position of the user's point of view E. In other words, this allows to promote the selection of a face aligned with the line between the user's point of view E and the at least one intersection of the 3D model with the ray. This is especially useful if the 3D model is partially rendered outside the field of view. In this case, the method will penalize selection of faces outside the field of view.

In order to retrieve the position and/or orientation of the user's head, a head tracking may be done by any technology able to detect a change of posture or a motion. As an example, there are headsets or glasses providing such information in Virtual, Mixed or Augmented Reality. In order to retrieve the direction and/or orientation of the user's gaze, eyes tracking technology may be used.

Figure 2:
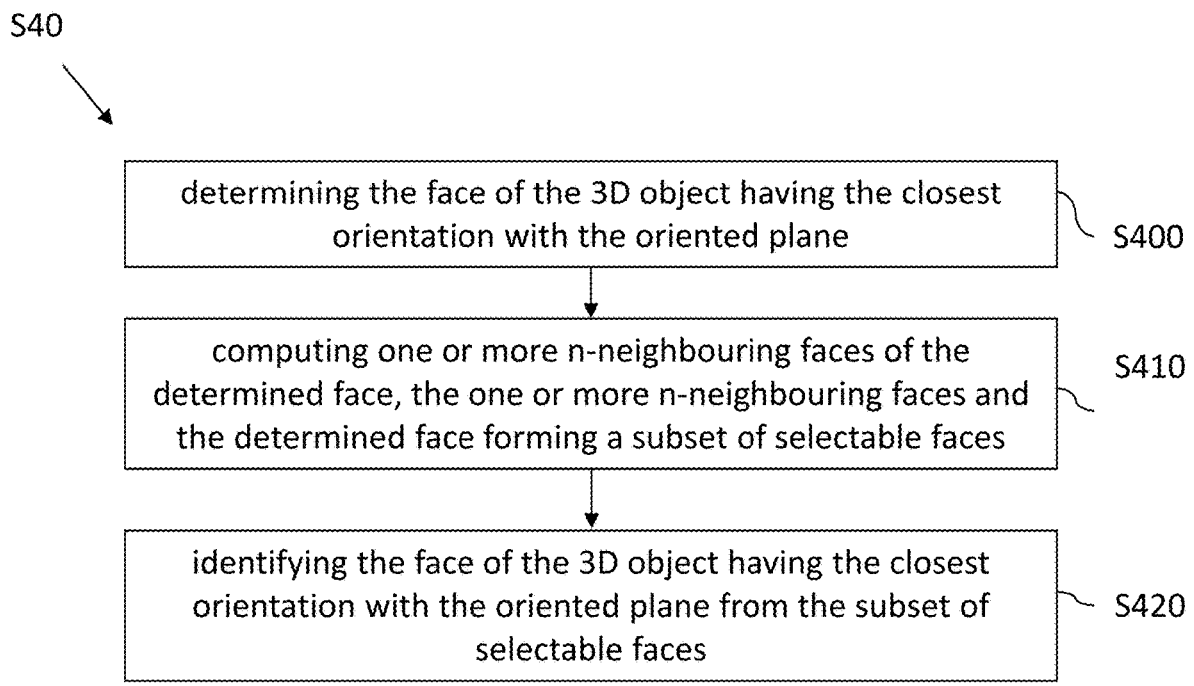
FIG. 2 shows an example of a flowchart of step S40 of the method.

In examples, with reference to the example of FIG. 2, the identifying S40 may further comprise determining S400 the face of the 3D object having the closest orientation with the oriented plane. The identifying S40 may further comprise computing S410 one or more n-neighboring faces of the determined face, the one or more neighbor faces and the determined face forming a subset 230 of selectable faces. A n-neighboring face of a determined face is a face sharing an edge with a n−1 neighboring face of the determined face and not sharing an edge with the n−2 neighboring face. Therefore, a 1-neighbouring face of a determined face is a face sharing an edge with the determined face and a 2-neighbouring face of a determined face is a face sharing an edge with a 1-neighbouring face of the determined face and not sharing an edge with the determined face. The identifying S40 further comprises identifying S420 the face of the 3D object having the closest orientation with the oriented plane from the subset 230 of selectable faces. n may be predetermined based on the size of the faces of the 3D objects. n may also be updated based on the size of the faces forming the subset 230 or on the size of the visible surface from the user's point of view E of the faces forming the subset 230 and/or on the distance between the point of view of the user and the determined face. n may be also predetermined based on the device specifications or based on the user preferences.

The determining S400 and S420 may also be performed by determining the face of the 3D object having the closest direction or by determining the face minimizing the function $f$ of equations (1) or (2). All combinations between the determining S400 and S420 may be used. For example, the determining S400 may be done by determining the face of the 3D object having the closest direction and the determining S420 may be done by determining the face minimizing the function $f$.

In another example, the determining S400 and the determining S420 may be done by determining the face minimizing the function $f$. In this case, during the determining S400, the weight $w_1$ may be four times greater than $w_2$ and during the determining S420 the weight $w_1$ may be four times smaller than $w_2$.

In examples, the method may further comprise modifying a first rendering of the faces of subset 230 of selectable faces. The subset 230 of selectable faces is computed during the step S410. As explained above, the subset 230 is, for example, computed based on the determined face during the determining S40. The size of the subset 230 depends of the value of n used in the computing S410. In an example, the value of n may be computed to ensure the visible surface from the point of view of the user is always large enough for the user to easily identify it. Modifying the rendering of the subset 230 helps the user to identify which faces will be considered as selectable during the step S420. Therefore, the user will easily identify that the face of interest is not amongst this subset 230 and therefore modify their hand's position and/or orientation to change the subset 230 during the step S410.

Figure 11:
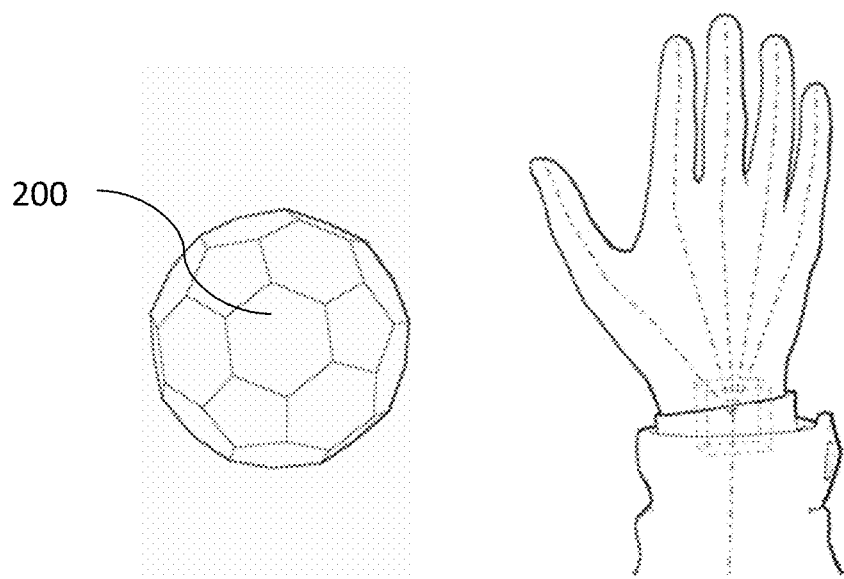
FIGS. 11, 12, 13, 14, 15, 16, 17, 18, 19, 20 and 21 illustrate the methods.

As shown as an example in FIG. 11, the rendering of a face of the 3D object is not modified by the method when the detecting S20 does not happen.

In an example, the user, after identifying the subset 230 of selectable faces, may modify their hand's position in order to change the subset 230 of selectable faces and/or they may modify their hand's orientation in order to change the identified face 210 among the same subset 230 of selectable faces. As shown in examples of FIG. 16 and FIG. 17, the subset 230 of selectable faces is updated when the hand's position and/or orientation is modified.

The modification of the rendering may be done in various ways. The modification of the rendering may be done during the computing S410 and/or identifying S420. As an example, the modification of the rendering may be performed by highlighting the selectable faces. As another example, the modification of the rendering may be performed by applying a specific texture to the selectable faces. The rendering may also be modified only for the edges of the selectable faces. For example, the edges may be highlighted or thickened. In another example, the modification of the rendering may also comprise a zoom-in and a disconnection of the selectable faces from the 3D object. The modification of the rendering may be completed by any another feedback to the user such as the automatic snapping of a graphical user information on the identified face. The modification of the rendering may also appear on top of the hands of the user by changing their representation. For example, the color of the hands could change, or lines may be overlaid on top of the fingers.

In examples, the method may further comprise modifying a second rendering of the identified face 210. The identified face 210 may be, for example, the face identified during the step S40. Therefore, the modification of rendering of the identified face 210 starts and helps the user to select the face of interest.

The identified face 210 may also be, for example, the face identified during the step S420. The identified face 210 may also be, for example, the face determined during the step S400. In these cases, for example, a second and a third rendering might be different than the first rendering of the subset 230 of selectable faces. The second rendering might also be different than the third rendering. The first and/or the second and/or the third renderings improve user interactions with the 3D object in the 3D environment: indeed, the user may more easily grasp during step S420 if they need to change their hand's position in order to change the subset 230 of selectable faces and/or they may modify their hand's orientation in order to change the identified face 210 among the same subset 230 of selectable faces. Less user interactions are required in order to select the wanted face.

Figure 12:
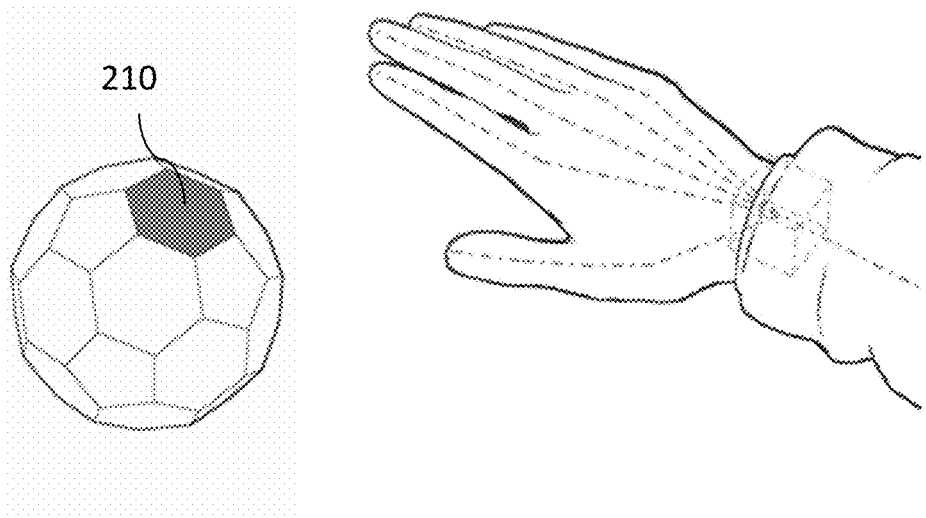

FIG. 11 and FIG. 12 show examples where the rendering of the 3D object 200 is modified only when a hand gesture comprising an adduction of all fingers except thumb is detected during step S20.

Figure 16:
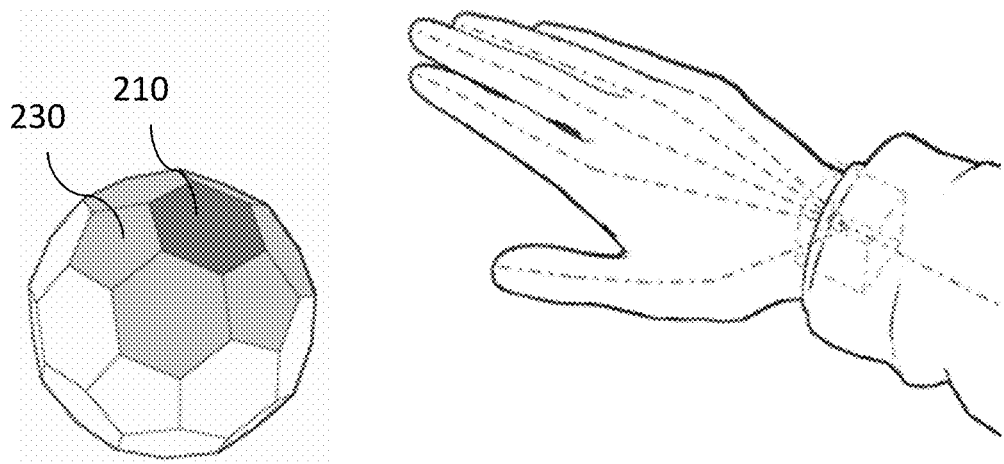
Figure 17:
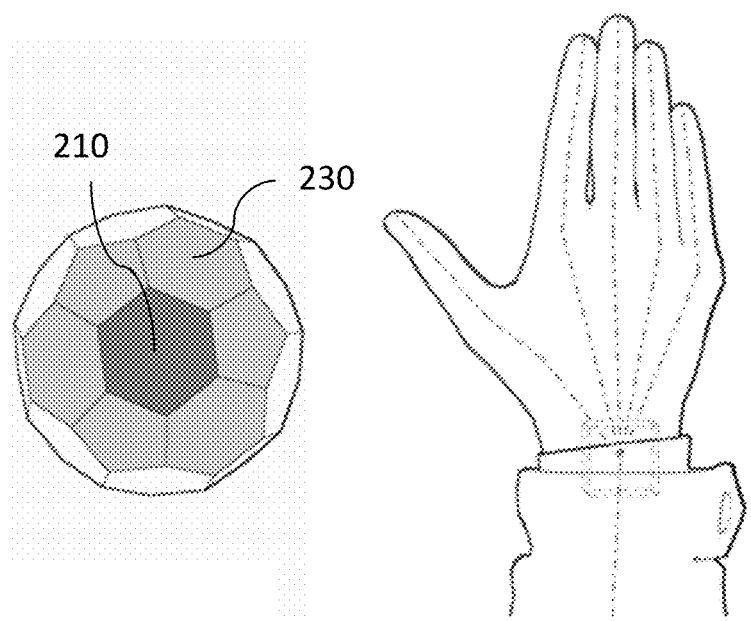

As an example the first and second renderings are different, therefore the user may easily identify the subset 230 of selectable faces and the identified face 210. An example is shown in FIG. 16 and FIG. 17.

The modification of the rendering may be performed in various ways. In an example, the rendering may be performed by highlighting the selectable faces. In another example, the rendering may be performed by applying a specific texture to the selectable faces. The rendering may also be modified only for the edges of the selectable faces, e.g. the edges may be highlighted or thickened. In another example, the modification of the rendering may also comprises a zoom-in and a disconnection of the selectable faces from the 3D object. The modification of the rendering may be completed by any another feedback to the user such as the automatic snapping of a graphical user information on the identified face. The modification of the rendering may also appear on top of the hands of the user by changing their representation; e.g. the color of the hands could change, or lines could be overlaid on top of the fingers.

A good balance may be found between providing continuous user feedback and avoiding an excessive popping. Providing continuous user feedback may be defined as having the method responsive to the user's input. In other words, for example, as soon as the user provides an input, the method should update with no visible delay, the result of the identifying S40 and/or the result of the determining S400 and/or the result of the computing S410 and/or the result of the identifying S420. By having the method responsive to the user's input, there is a risk that the method provides an excessive popping. This term defines the tendency of a user interface to switch promptly and continuously between various states. In the method, it may be for example a prompt and quick switch between two or more faces considered as the identified face.

As an example, the identified face with a modified rendering may be kept until a better candidate of the same dimension has been confidently identified. In other words, the identifying S40 may comprise minimizing the function $f$, the switching from a current identified face to another face will not be done as soon as the value of the function $f$ for the other face is smaller than the value of the function $f$ for the current identified face. To avoid an excessive popping, a penalizing threshold or a penalizing factor may be used during the identifying S40 for the comparison of the value of the result of the function $f$ of the current identified face to another face. In other words, the identified face with a modified rendering may be kept until a better candidate of the same dimension is minimizing the function $f$, with an added penalizing threshold and/or multiplied by a penalizing factor to the result of the function $f$ of the candidate. Alternatively, an excessive popping may be avoided by switching from a current identified face to another face only after detecting that the user's hand is not moving for a certain amount of time.

The continuous user feedback may be done, for example, by a modification of the rendering of the 3D object 200 and/or by adding virtual representations near the 3D object 200 and/or near the hands user and/or by haptic feedback from the devices.

In examples, the faces of the 3D objects in the method may be triangles and/or quadrangles and/or topological faces and/or parametric surfaces and/or procedural surfaces. A topological face is a group of neighboring triangles or a group of neighboring quadrangles, which form a larger "logical" continuous face while still potentially displaying a wide variety of different orientations between each primitive, especially when the topological face is large. In a CAD program, a topological face is most of the time bounded by topological edges. By neighboring triangles and/or neighboring quadrangles, it is to be understood that each triangle or quadrangle of the group is a 1-neighbouring triangle or quadrangle of a triangle or quadrangle of the said group. For example, a CAD object representing a car may be composed of few thousands triangles which may be grouped in less than one hundred topological faces. For example, one topological face may represent the superior surface of the seat of the car.

For all types of faces, the direction is materialized by its normal vector and the orientation by a line parallel to this normal vector. For topological faces, the normal vector may be edited. Indeed, the topological face may be composed of triangles or quadrangles oriented in various orientations, therefore it may be difficult to compute a meaningful normal vector for this type of topological face. Displaying the normal vector during all the steps of the methods may contribute to improve user interactions in the 3D environment during, e.g. during the design process of a 3D model. Indeed, the user is graphically assisted to identify what are the orientation and the position of the topological face.

Figure 9:
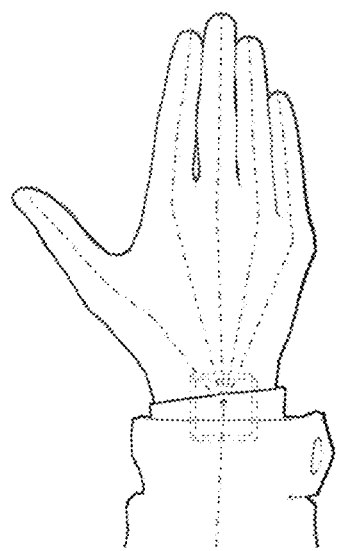
FIG. 9 shows an example of a posteroanterior view of a virtual skeleton of a right hand in a detected posture.
Figure 10:
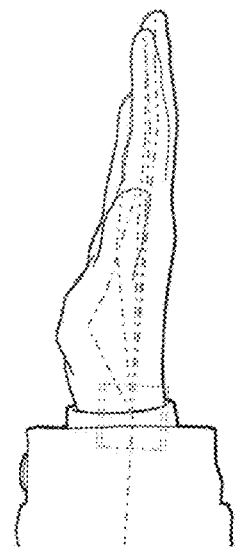
FIG. 10 shows an example of a lateral view of a virtual skeleton of a right hand in a detected posture.

In examples, the detecting S20 of the hand gesture comprises an adduction of all fingers except thumb and an abduction of the thumb. As shown in FIG. 5, abduction 250 is the gesture of a body part away from the body's midline. For all fingers, abduction moves the fingers away from the line 190. An example of a detected posture during the step S20 for a right hand is shown in FIG. 9 and FIG. 10.

The abduction of the thumb is the result of a contraction of muscles including the abductor pollicis brevis muscle.

Detecting an adduction of all fingers except thumb and an abduction of the thumb is advantageous for two reasons. First, an adduction of all fingers except thumb and an abduction of the thumb reduces the risk of confusion between the detected posture and the default posture. Second, as it is shown in FIG. 10, an adduction of all fingers except thumb and an abduction of the thumb tends to flatten the oriented plane formed with the palm and/or the back of the hand, therefore the determining S30 is more reliable.

Figure 13:
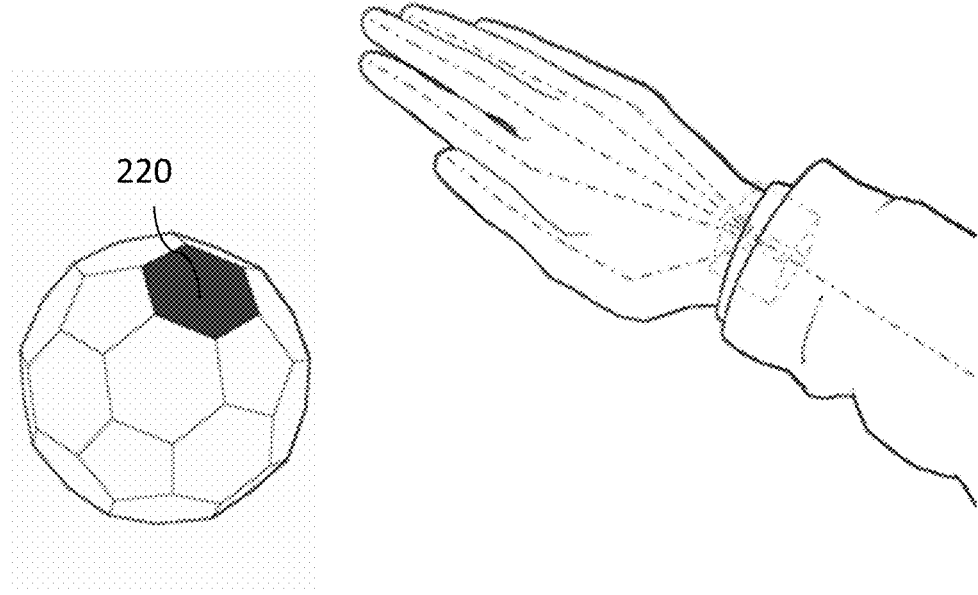

In examples, the method further comprises selecting the identified face 210 of the 3D object by detecting that the hand gesture further comprises an adduction of the thumb. An example of selection by detecting that the hand gesture further comprises an adduction of the thumb is shown in FIG. 12 and FIG. 13. In other words, the identified face 210 of the 3D object is added to the current selection of faces when the hand gesture further comprises an adduction of the thumb. As shown in FIG. 13 to FIG. 15, the identified face 210 is therefore considered as a selected face 220. As an example, these figures show a third rendering is applied to the selected face. This detection may happen during step S40 or S400 or S420. Users may therefore use the method iteratively to select multiple faces of interest.

In examples, the method may further comprise detecting that the hand gesture further comprises an abduction of all fingers except thumb and deselecting the selected face. The detection may happen during any step of the method. As an example, the user may therefore deselect the last selected face. As another example, the user may deselect their entire current selection of faces.

In examples, the detecting of the hand gesture may further comprise
- detecting an extension of the proximal and distal interphalangeal joints of all fingers except thumb; and/or
- detecting an extension of the metacarpophalangeal joint of all fingers except thumb; and/or
- detecting that all side-by-side fingers except thumb are substantially in contact.

Any combination between these three detecting is possible. These detecting may happen during steps S20 and/or S40. These detecting may also happen during S400 and/or S420.

The extension of the proximal and distal interphalangeal joints of all fingers except thumb is the result of a contraction of muscles including the dorsal and palmar interossei muscles of these fingers and lumbricals muscles of these fingers.

The extension of the metacarpophalangeal joint of all fingers except thumb is the result of a contraction of muscles including extensor digitorum muscle.

The contact side by side of all fingers except thumb is the result of an abduction of these fingers. The contact may need to be substantial to be detected. Indeed, in order to have a more robust detecting of the contact of side-by-side fingers, the detecting needs to consider only substantial contacts. In other words, because of the shape and the consistency of the fingers, the detecting may consider two side-by-side fingers may not be in contact even if there are one or more small surfaces of the two side-by-side fingers in contact. Detecting one or more of these gestures reduces the risk of confusion between the detected posture and the default posture. If these three gestures are performed, all fingers except thumb are in line with the oriented plane of the palm and/or the back of the hand improving the determining S30.

The invention claimed is:

1. A computer-implemented method for selecting a face among faces of a 3D object in a 3D immersive environment of a CAD system, each face being oriented in the 3D immersive environment, comprising:
   - displaying the 3D object in the 3D immersive environment, each face of the 3D object defining a plane;
   - detecting a hand gesture of a hand of a user including an adduction of all fingers except thumb; and
   - while the hand gesture is performed:
     - determining an oriented plane obtained from a palm and/or a back of the hand in the 3D immersive environment,
     - comparing the respective orientation of at least part of each defined plane of the 3D object with the oriented plane formed with a palm and/or a back of the hand, and
     - identifying, as a result of the comparing, a plane of the 3D object having a closest orientation with the oriented plane formed with a palm and/or a back of the hand, thereby identify a face of the 3D object having the closest orientation with the oriented plane formed with a palm and/or a back of the hand.

2. The computer-implemented method of claim 1, wherein each face of the 3D object and the oriented plane further have a normal, and
   wherein the identifying further includes identifying the face of the 3D object having a closest direction between the normal of said face and the normal of the oriented plane.

3. The computer-implemented method of claim 1, wherein each face of the 3D object and the oriented plane further have a position in the 3D immersive environment, and wherein the identifying further includes:
   minimizing a function $f$:

$$f(\text{Face}) = w1 * \|FH\| + w2 * \widehat{FH}$$

wherein:
   Face is a face of interest;
   $\{w1 \in \mathbb{R} | w1 \geq 0\}$ and $\{w2 \in \mathbb{R} | w2 \geq 0\}$ and $\{w1+w2 > 0\}$;
   $\|FH\|$ is an Euclidian distance in the 3D immersive environment between the position of the face Face and a position H of the oriented plane of the hand; and
   $\widehat{FH}$ is an angle in the 3D immersive environment between the normal of the face Face and the normal of the oriented plane of the hand.

4. The computer-implemented method of claim 3, wherein the term $\|FH\|$ of the function $f$ is replaced by $\|FH'\|$ with H' being computed by:

$$H' = E + EH * \max(1, a*(\|EO\max\|)/\|EH\max\|)$$

wherein:
   H' is the position of the oriented plane of a virtual hand;
   E is the position of the user's point of view;
   H is the position of the oriented plane of the user's hand;
   EH is a vector from E to H;
   Omax is the position of the furthest face of the 3D object from E;
   Hmax is the furthest position of the center of the user's hand from E in a transverse plane of the user's body;
   $\{a \in \mathbb{R}^*\}$;
   $\|EO\max\|$ is the norm of the vector from E to Omax; and
   $\|EH\max\|$ is the norm of the vector from E to Hmax.

5. The computer-implemented method of claim 3, wherein a term $\|FH\|$ or $\|FH'\|$ of the function $f$ further includes a Euclidean distance in the 3D immersive environment between the position of the face and at least one intersection of the 3D model with a ray being cast from a center of a head or a dominant eye or the point between eyes to a center of the 3D model.

6. The computer-implemented method of claim 1, wherein the identifying further comprises:
   determining the face of the 3D object having the closest orientation with the oriented plane;

computing one or more n-neighboring faces of the determined face, the one or more n-neighboring faces and the determined face forming a subset of selectable faces; and identifying the face of the 3D object having the closest orientation with the oriented plane from the subset of selectable faces.

7. The computer-implemented method of claim 6, further comprising modifying a first rendering of the faces of subset of selectable faces.

8. The computer-implemented method of claim 1, further comprising modifying a second rendering of the identified face.

9. The computer-implemented method of claim 1, wherein faces of 3D objects are at least one selected from among triangles and/or quadrangles and/or topological faces and/or parametric surfaces and/or procedural surfaces.

10. The computer-implemented method of claim 1, wherein the detecting the hand gesture includes an adduction of all fingers except the thumb and an adduction of the thumb.

11. The computer-implemented method of claim 1, further comprising:

selecting the identified face of the 3D object by detecting that the hand gesture further includes an adduction of the thumb.

12. The computer-implemented method of claim 11, further comprising:

detecting that the hand gesture further includes an adduction of all fingers except the thumb; and
deselecting the selected face.

13. The computer-implemented method of claim 1, wherein the detecting of the hand gesture further comprises:
detecting an extension of proximal and distal interphalangeal joints of all fingers except the thumb; and/or
detecting an extension of a metacarpophalangeal joint of all fingers except the thumb; and/or
detecting that all side by side fingers except the thumb are substantially in contact.

14. A non-transitory data storage medium having recorded thereon a computer program including instructions allowing a computer to perform a method for selecting a face among faces of a 3D object in a 3D immersive environment of a CAD system, each face being oriented in the 3D immersive environment, the method comprising:

displaying the 3D object in the 3D immersive environment, each face of the 3D object defining a plane;
detecting a hand gesture of a hand of a user including an adduction of all fingers except thumb; and
while the hand gesture is performed:
determining an oriented plane obtained from a palm and/or a back of the hand in the 3D immersive environment,
comparing the respective orientation of at least part of each defined plane of the 3D object with the oriented plane formed with a palm and/or a back of the hand, and
identifying, as a result of the comparing, a plane of the 3D object having a closest orientation with the oriented plane formed with a palm and/or a back of the hand, thereby identify a face of the 3D object having the closest orientation with the oriented plane formed with a palm and/or a back of the hand.

15. The non-transitory data storage medium of claim 14, wherein each face of the 3D object and the oriented plane further have a normal and wherein the identifying further includes identifying the face of the 3D object having a closest direction between the normal of said face and the normal of the oriented plane.

16. The non-transitory data storage medium of claim 14, wherein each face of the 3D object and the oriented plane further has a position in the 3D immersive environment, and wherein the identifying further comprises:
minimizing a function $f$:

$$f(\text{Face}) = w1 * \|FH\| + w2 * \widehat{FH}$$

wherein:
Face is a face of interest;
$\{w1 \in \mathbb{R} | w1 \geq 0\}$ and $\{w2 \in \mathbb{R} | w2 \geq 0\}$ and $\{w1+w2 > 0\}$;
$\|FH\|$ is an Euclidian distance in the 3D immersive environment between the position of the face Face and a position H of the oriented plane of the hand; and
$\widehat{FH}$ is an angle in the 3D immersive environment between the normal of the face Face and the normal of the oriented plane of the hand.

17. The non-transitory data storage medium of claim 16, wherein a term $\|FH\|$ of the function $f$ is replaced by $\|FH'\|$ with H' being computed by:

$$H' = E + EH * \max(1, a * (\|EO\max\|)/\|EH\max\|)$$

wherein:
H' is the position of the oriented plane of a virtual hand;
E is the position of the user's point of view;
H is the position of the oriented plane of the user's hand;
EH is a vector from E to H;
Omax is the position of the furthest face of the 3D object from E;
Hmax is the furthest position of the center of the user's hand from E in a transverse plane of the user's body;
$\{a \in \mathbb{R}*\}$;
$\|EO\max\|$ is the norm of the vector from E to Omax; and
$\|EH\max\|$ is the norm of the vector from E to Hmax.

18. The non-transitory data storage medium of claim 16, wherein a term $\|FH\|$ or $\|FH'\|$ of the function $f$ further includes a Euclidean distance in the 3D immersive environment between the position of the face and at least one intersection of the 3D model with a ray being cast from a center of a head or a dominant eye or a point between eyes to a center of the 3D model.

19. The non-transitory data storage medium of claim 14, wherein the identifying further comprises:
determining the face of the 3D object having a closest orientation with the oriented plane;
computing one or more n-neighboring faces of the determined face, the one or more n-neighboring faces and the determined face forming a subset of selectable faces; and
identifying the face of the 3D object having a closest orientation with the oriented plane from the subset of selectable faces.

20. A system comprising:
a display; and
processing circuitry communicatively coupled with memory, the memory storing a computer program including instructions for selecting a face among faces of a 3D object in a 3D immersive environment of a CAD system, each face being oriented in the 3D immersive environment, that when executed by the processing circuitry causes the processing circuitry to be configured to:
display the 3D object in the 3D immersive environment, each face of the 3D object defining a plane, detect a hand gesture of a hand of a user including an adduction of all fingers except thumb, and while the hand gesture is performed:
- determine an oriented plane obtained from a palm and/or a back of the hand in the 3D immersive environment,
- compare the respective orientation of at least part of each defined plane of the 3D object with the oriented plane formed with a palm and/or a back of the hand, and
- identify, as a result of the comparison, a plane of the 3D object having a closest orientation with the oriented plane.

\* \* \* \* \*